United States Patent
Huang et al.

(10) Patent No.: US 6,908,840 B2
(45) Date of Patent: Jun. 21, 2005

(54) METHOD OF FILLING BIT LINE CONTACT VIA

(75) Inventors: Tse-Yao Huang, Taipei (TW); Yi-Nan Chen, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 128 days.

(21) Appl. No.: 10/640,096

(22) Filed: Aug. 13, 2003

(65) Prior Publication Data

US 2004/0209427 A1 Oct. 21, 2004

(30) Foreign Application Priority Data

Apr. 15, 2003 (TW) .......................... 92108627 A

(51) Int. Cl.⁷ ...................... H01L 21/44; H01L 21/4763
(52) U.S. Cl. ........................................ 438/597; 438/622
(58) Field of Search ................................ 438/597, 614, 438/622

(56) References Cited

U.S. PATENT DOCUMENTS

| | | | | |
|---|---|---|---|---|
| 6,028,360 A | * | 2/2000 | Nakamura et al. | 257/758 |
| 6,686,239 B2 | * | 2/2004 | Nam et al. | 438/244 |
| 6,723,597 B2 | * | 4/2004 | Abbott et al. | 438/238 |
| 6,852,619 B2 | * | 2/2005 | Okabe | 438/637 |

\* cited by examiner

Primary Examiner—David S. Blum
(74) Attorney, Agent, or Firm—Quintero Law Office

(57) ABSTRACT

A method of filling a bit line contact via. The method includes providing a substrate having a transistor, with a gate electrode, drain region, and source region, on the substrate, forming a first barrier layer overlying the sidewall of the gate electrode, drain region, and source region, forming a first conductive layer overlying the first barrier layer, removing the first barrier layer and first conductive layer above the source region, forming an insulating barrier layer overlying the substrate, forming a first dielectric layer overlying the insulating barrier layer above the source region, forming a second dielectric layer overlying the substrate, forming a via through the second dielectric layer and the insulative barrier layer, exposing the first conductive layer, forming a second barrier layer overlying the surface of the via, and filling the via with a second conductive layer.

20 Claims, 7 Drawing Sheets

METHOD OF FILLING BIT LINE CONTACT VIA

BACKGROUND OF THE INVENTION

1. Field of the Invention

The present invention relates to a method of filling a bit line contact via, and more specifically to a method of forming a conductive layer in the bit line contact via.

2. Description of the Related Art

As the integrity of integrated circuits increases, the size of semiconductor device is reduced. A dynamic random access memory (DRAM) device for example, has design rule for 64 MB DRAM of 0.3 µm or less, with design rule of 128 MB and 256 MB as low as 0.2 µm or less.

In a bit line contact structure, for example, when the line width is reduced to approximately 0.11 µm, the width of a drain region exposed by a bit line contact via is also reduced to approximately 0.038 µm or less. When forming a conductive layer as bit line contact (CB) in the bit line contact via, either CB opening or word line-bit line short occur frequently, resulting in device failure, thereby negatively affecting the yield and cost of the process.

FIGS. 1A through 1F are cross-sections illustrating these problems in the conventional method of filling a bit line contact via.

In FIG. 1A, first, a substrate 100, such as single crystalline silicon, having a transistor structure, is provided. The substrate 100 has a gate electrode 120 protruding from an active surface of substrate 100. A drain region 112 and source region 114 are disposed on the active surface respectively on two sides of the gate electrode 120. Gate electrode 120 is a word line, having a multi-level structure as needed. For example, gate electrode 120 in FIG. 1A can have gate dielectric layer 121, polycrystalline silicon layer 122 and metal silicide layer 123 as conductive layers, and hard mask layer 124 sequentially from the active surface of substrate 100. Gate electrode 120 further has a spacer 125 on the sidewall, resulting in width of exposed drain region 112 between two neighboring gate electrodes 120 as large as approximately 0.038 µm or less when design rule is reduced to approximately 0.11 µm.

In FIG. 1B, a dielectric layer 130 and patterned resist layer 191 are sequentially formed on substrate 100. The patterned resist layer 191 has an opening 191a exposing a part of dielectric layer 130, a predetermined position of a subsequent bit line contact via. The dielectric is usually about 0.3 µm to about 1.0 µm thick.

The subsequent steps include removing the exposed dielectric layer 130 in order to form the bit line contact via exposing drain region 112, and filling a metal layer in the bit line contact via as a bit line contact. FIGS. 1C and 1D show CB opening and FIGS. 1E and 1F show word line-bit line short occurring in the aforementioned steps.

In FIG. 1C, dielectric layer 130 exposed by opening 191a is removed by anisotropic etching, using patterned resist layer 191 as an etching mask, in order to form a via 131, as a bit line contact via, exposing drain region 112. Then, patterned resist layer 191 is removed. As mentioned above, width of the exposed drain region 112 is approximately 0.038 µm or less, resulting in via 131 being extremely deep relative to the thickness of dielectric layer 130, about 0.3 µm to about 1.0 µm as disclosed. The etching reaction slows as dielectric layer 130 at the bottom of via 131 is etched, resulting in remaining dielectric layer 130 not being etched completely, at the bottom of via 131, thereby failing to expose drain region 112.

In FIG. 1D, a barrier layer 140 and conductive layer 150 are formed sequentially in via 131 as a bit line contact. The bit line contact fails to electrically connect to drain region 112 resulting from the remaining dielectric layer 130 between the barrier layer 140 and drain region 112. Thus, CB opening occurs.

In FIG. 1E, after the step shown in FIG. 1B, dielectric layer 130 exposed by opening 191a is removed by anisotropic etching, using patterned resist layer 191 as an etching mask, in order to form a via 131', as a bit line contact via, exposing drain region 112. Then, patterned resist layer 191 is removed. In order to completely remove the dielectric 130 at the bottom of via 131', over-etching is performed on dielectric 130. As shown in FIG. 1A or 1B, hard mask layer 124 and spacer 125 protect gate electrode 120 from electrically connecting to the subsequently formed bit line contact or bit line. Further, dielectric layer 130 is etched with high etch selectivity, of, for example, about 10, with respect to hard mask layer 124 and spacer 125 in order to prevent exposing the conductive layers, polycrystalline silicon layer 122 and metal silicide layer 123, during etching of dielectric 130, when dielectric layer 130 is silicon oxide and both the hard mask layer 124 and spacer 125 are silicon nitride. When over-etching is performed to force etching of the dielectric 130 at the bottom of via 131', a part of hard mask layer 124 and spacer 125 may be removed, thereby exposing the metal silicide layer 123, and more seriously, polycrystalline silicon layer 122 may be exposed.

In FIG. 1F, a barrier layer 140 and conductive layer 150 are formed sequentially in via 131' as a bit line contact. The exposed metal silicide layer 123 electrically connects to the bit line contact. Thus, word line-bit line short occurs.

SUMMARY OF THE INVENTION

Thus, objects of the present invention are to provide a method of filling a bit line contact via, avoiding CB opening and word line-bit line short in the process in order to improve process yield and decrease costs of the process.

In order to achieve the described objects, the present invention provides a method of filling a bit line contact via. First, a substrate having a transistor, having a gate electrode, drain region, and source region, on the substrate is provided. Then, a first barrier layer is formed overlying the sidewall of the gate electrode. Next, a first conductive layer is formed overlying the first barrier layer. Next, the first barrier layer and first conductive layer above the source region are removed. Next, an insulating barrier layer is formed overlying the substrate. Next, a first dielectric layer is formed overlying the insulating barrier layer above the source region. Next, a second dielectric layer is formed overlying the substrate. Next, a via through the second dielectric layer and the insulative barrier layer is formed, thereby exposing the first conductive layer. Further, a second barrier layer is formed overlying the surface of the via. Finally, the via is filled with a second conductive layer.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE INVENTION

The following embodiment is intended to illustrate the invention more fully without limiting the scope of the claims, since numerous modifications and variations will be apparent to those skilled in this art.

FIGS. 2A through 2J are cross-sections illustrating a method of filling a bit line contact via of the present invention.

Figure 1A:
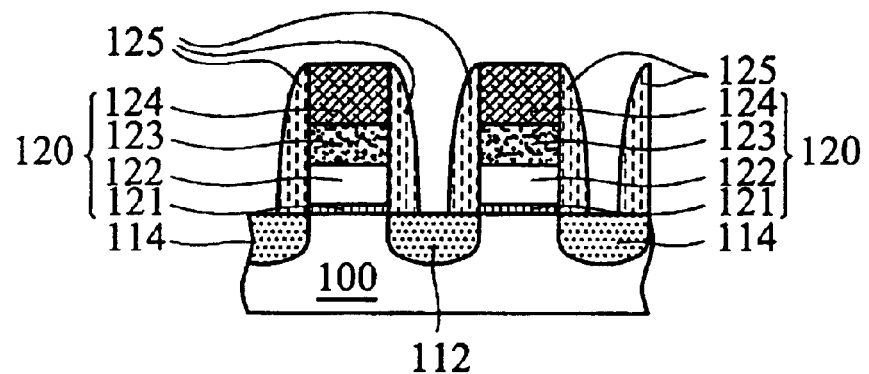
FIGS. 1A through 1F are cross-sections illustrating CB opening and word line-bit line short occurring in a conventional method of filling a bit line contact via.
Figure 1B:
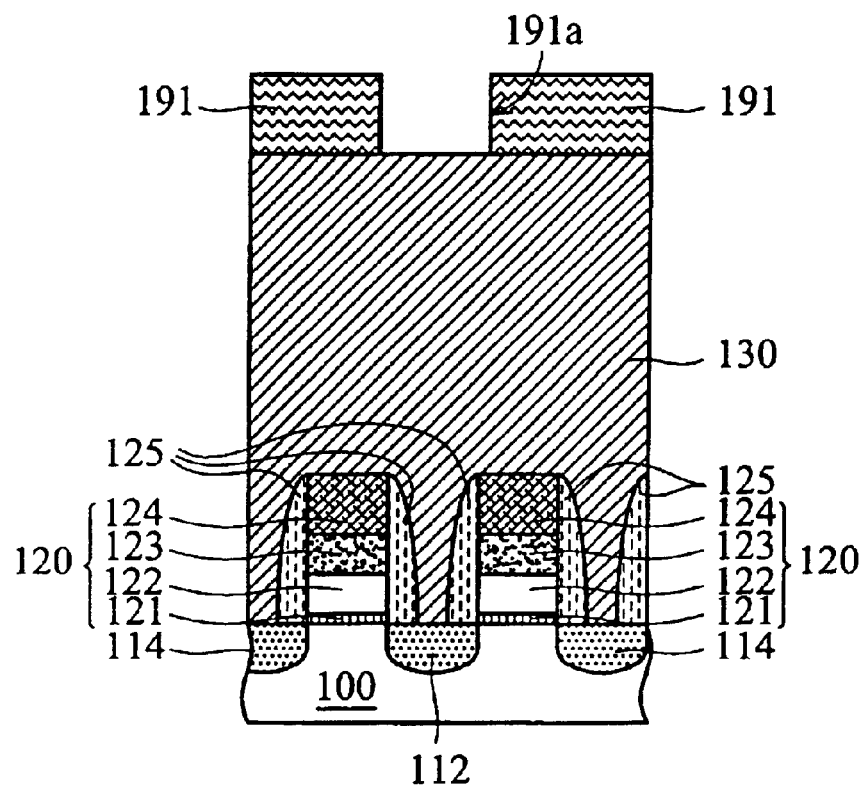
Figure 1C:
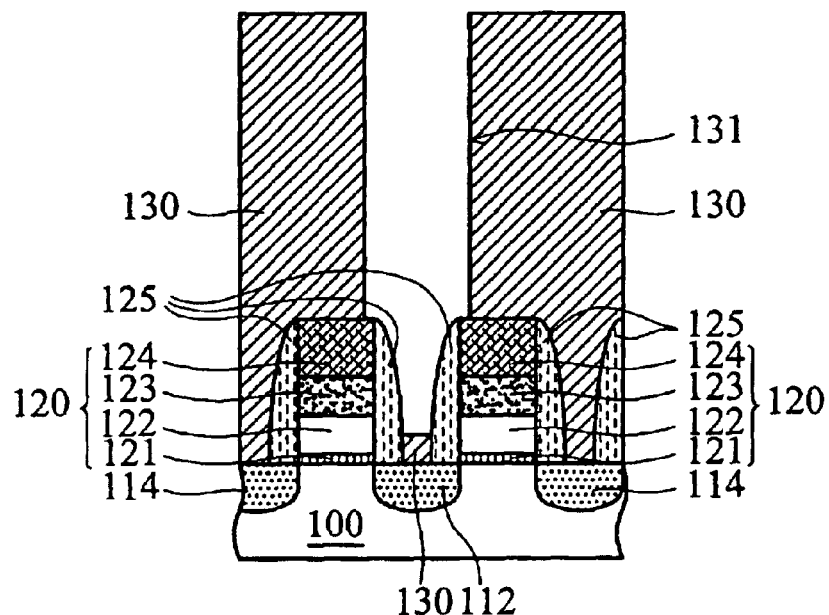
Figure 1D:
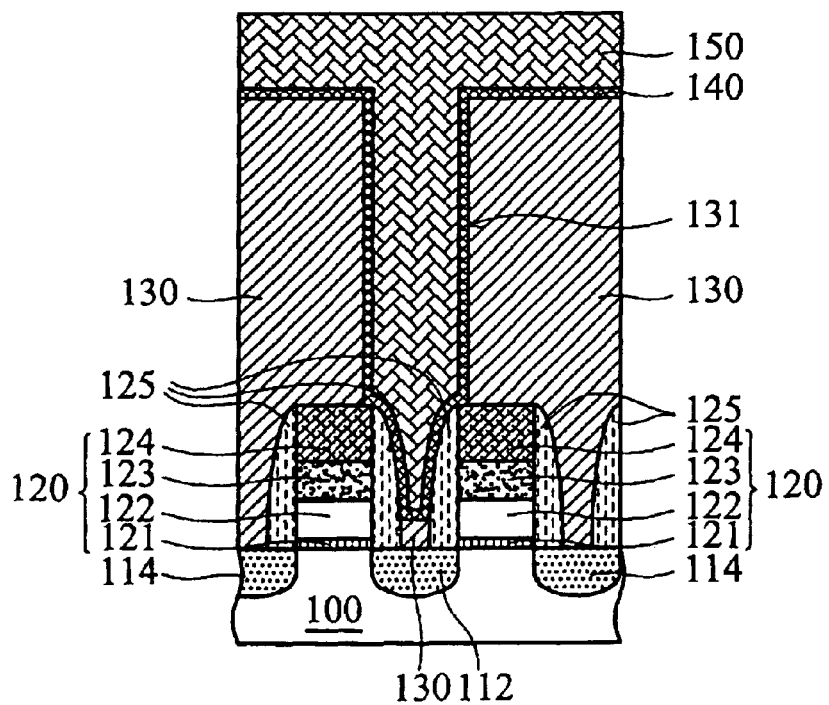
Figure 1E:
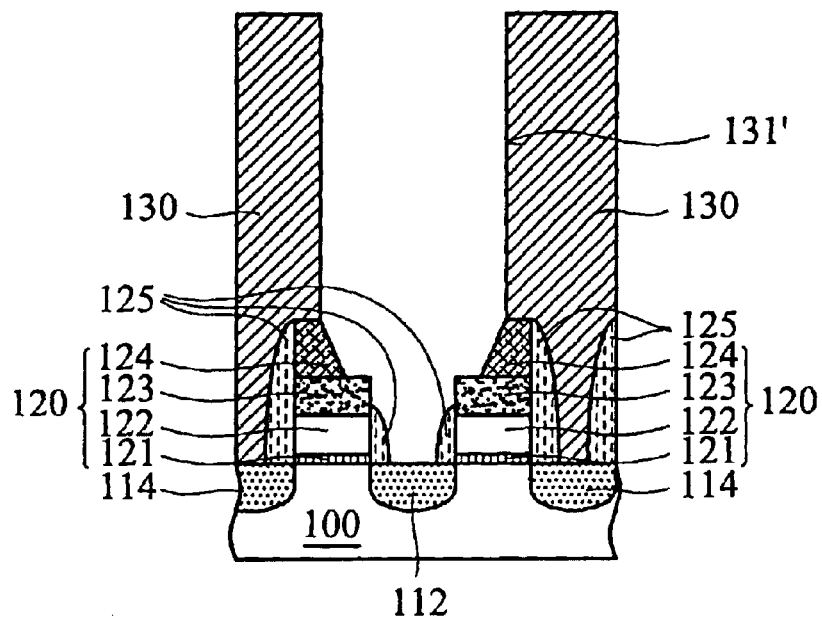
Figure 1F:
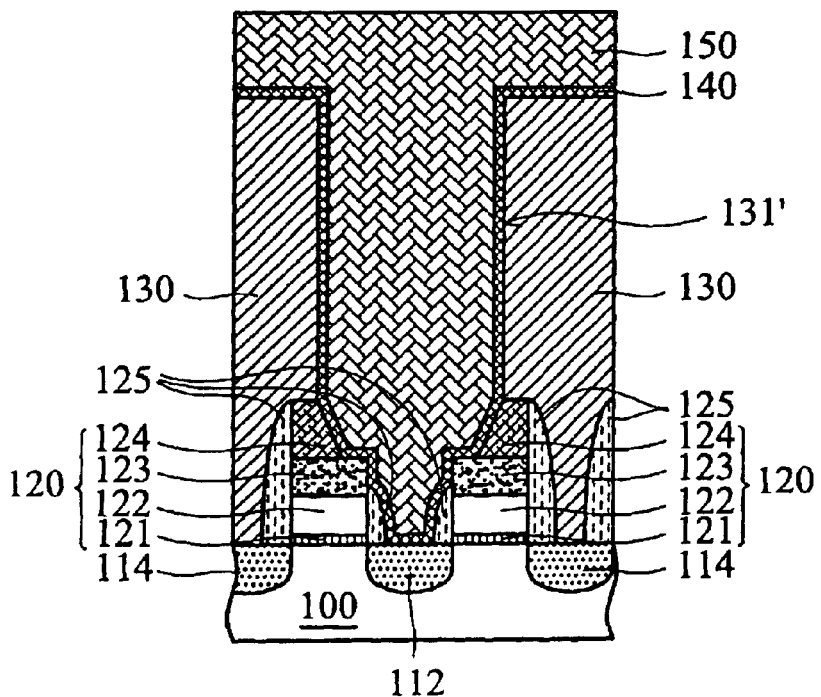
Figure 2A:
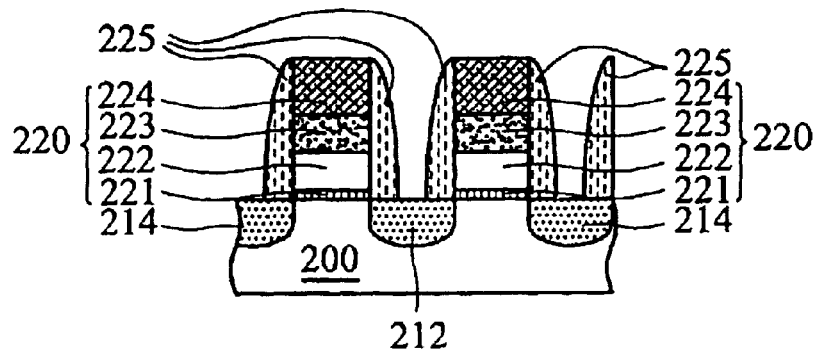
FIGS. 2A through 2J are cross-sections illustrating a method of filling a bit line contact via of the present invention.

In FIG. 2A, first, a substrate 200, such as single crystalline silicon, having a transistor structure is provided. The substrate 200 has a gate electrode 220 protruding from an active surface of substrate 200. A drain region 212 and source region 214 are disposed on the active surface respectively on two sides of the gate electrode 220. Gate electrode 220 is a word line, having a multi-level structure as needed. For example, gate electrode 220 in FIG. 2A can have gate dielectric layer 221 such as an oxide layer, polycrystalline silicon layer 222 and metal silicide layer 223, such as tungsten silicide, as conductive layers, and hard mask layer 224 such as silicon nitride sequentially from the active surface of substrate 200. Gate electrode 220 further has a spacer 225 such as silicon nitride on the sidewall, resulting in width of exposed drain region 212 between two neighboring gate electrodes 220 as large as approximately 0.038 $\mu$m or less when design rule is reduced to approximately 0.11 $\mu$m. Note that this structure of gate electrode 220 is an example, and is not intended to limit the scope of the present invention. Those skilled in the art will recognize the possibility for use of any disclosed gate electrode structure to process the present invention.

Figure 2B:
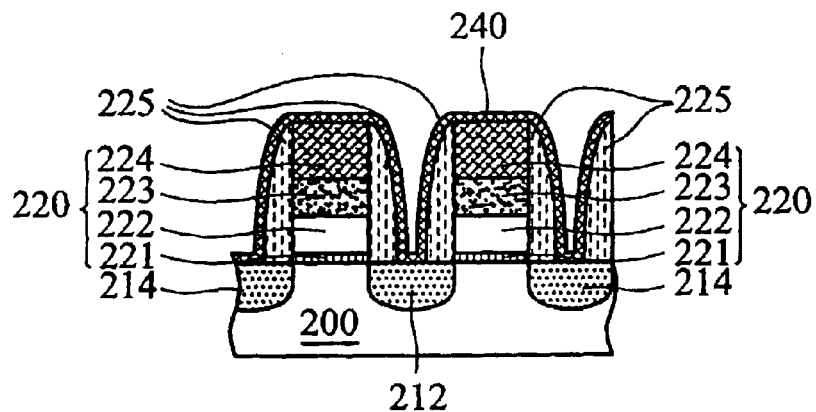

In FIG. 2B, a barrier layer 240 is formed overlying substrate 200. More specifically, barrier layer 240 is formed on the surface of spacer 225, drain region 212, and source region 214. The barrier layer 240 preferably has a TiN/Ti layer. Further, formation of barrier layer 240 can be divided into a plurality of sub-steps such as forming a titanium layer (not shown) overlying substrate 200 using physical vapor deposition (PVD) such as sputtering, and annealing substrate 200 at nitrogen atmosphere, thereby finishing the formation of barrier layer 240. The barrier layer 240 prevents inter-diffusion between either drain region 212 or source region 214 and a conductive layer subsequently formed thereon, which can negatively affect the electrical performance of an end product. The barrier layer 240 can further be a glue layer assisting to fasten the subsequently formed conductive layer on spacer 225, drain region 212, and source region 214.

Figure 2C:
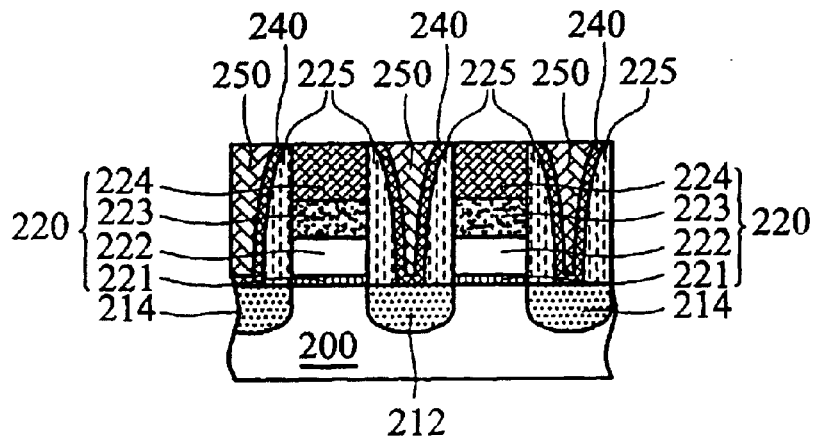

In FIG. 2C, a conductive layer 250 is formed overlying barrier layer 240 using chemical vapor deposition (CVD) or PVD. It is preferable to form a tungsten layer as the conductive layer 250 using CVD. Etching or chemical mechanical polishing (CMP) is then performed, preferably using hard mask layer 224 as stop layer, to remove the extra barrier layer 240 and conductive layer 250, thereby leaving barrier layer 240 and conductive layer 250 between two neighboring gate electrodes 220. Compared to the known art, the prevent invention forms barrier layer 240 and conductive layer 250 prior to forming a dielectric on substrate 200, avoiding CB opening resulting from the dielectric layer remaining at the bottom of a subsequently formed via, or word line-bit line short resulting from over-etching the remained dielectric layer, thereby improving process yield and decreasing costs.

Figure 2D:
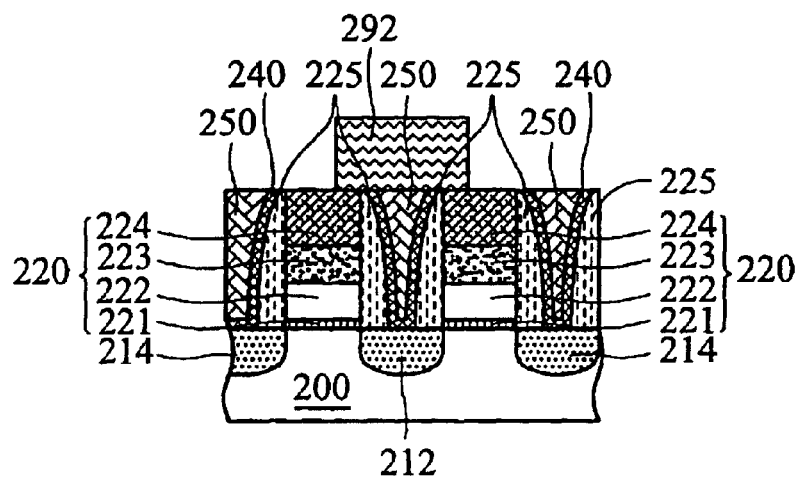

In FIG. 2D, a patterned resist layer 292 is formed overlying substrate 200, exposing the conductive layer 250 above source region 214 or other positions not forming contact.

Figure 2E:
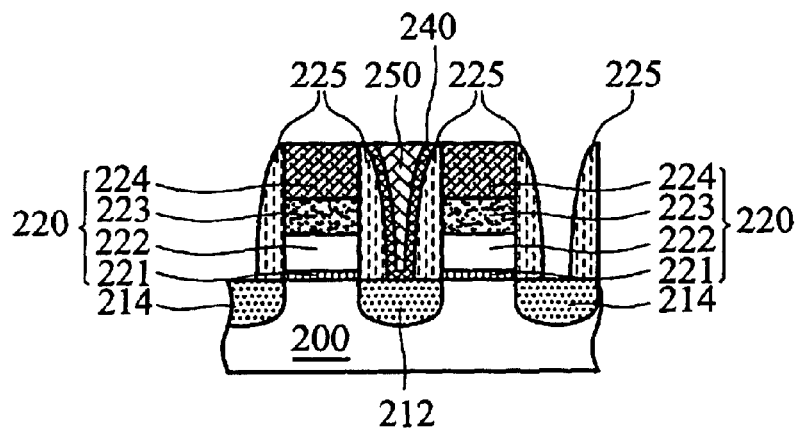

In FIG. 2E, the exposed conductive layer 250 and the barrier layer intermediately under the exposed conductive layer 250 are removed by anisotropic etching using the patterned resist layer 292 as a mask in order to leave barrier layer 240 and conductive layer 250 above drain region 212 predetermined to form bit line contact. The conductive layer 250 and barrier layer 240 are preferably etched using reactive ion etching (RIE), using a gas mixture such as $NF_3$, $Cl_2$, $O_2$, and other gases, with high etch selectivity with respect to spacer 225, using spacer 225 as a stop layer.

Figure 2F:
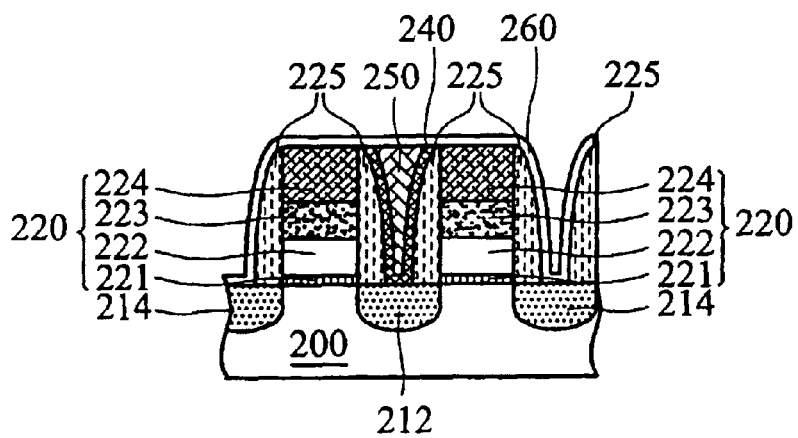

In FIG. 2F, an insulating barrier layer 260 such as silicon nitride is formed conformally overlying substrate 200, more specifically, on gate electrode 220, spacer 225, source region 214, conductive layer 250, and barrier layer 240. When a dielectric layer such as oxide layer is subsequently formed overlying substrate 200, insulating barrier layer 260 prevents inter-diffusion between the dielectric layer and conductive layer 250, which can negatively affect the electrical performance of substrate 200.

Figure 2G:
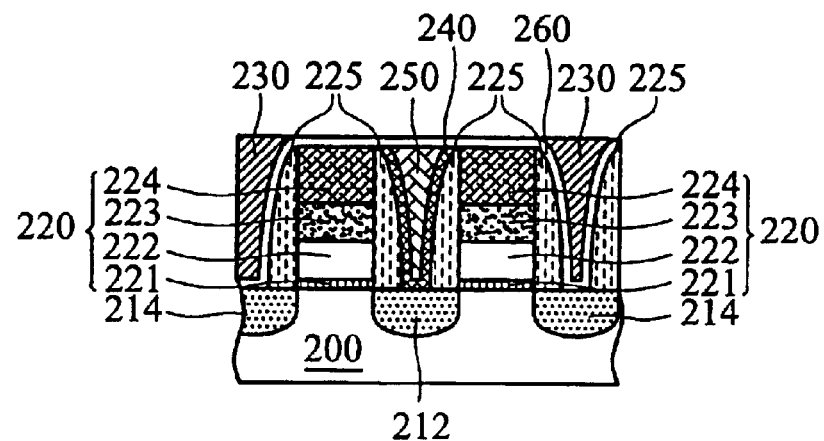

In FIG. 2G, a dielectric layer 230 is formed overlying insulating barrier layer 260 using such methods as CVD. The unwanted dielectric layer 230 is then removed by planarizing substrate 200 using CMP or etching, using the insulating barrier layer 260 as a stop layer, thereby leaving the dielectric layer 230 above source region 214 and substrate 200 not predetermined to form contact.

Figure 2H:
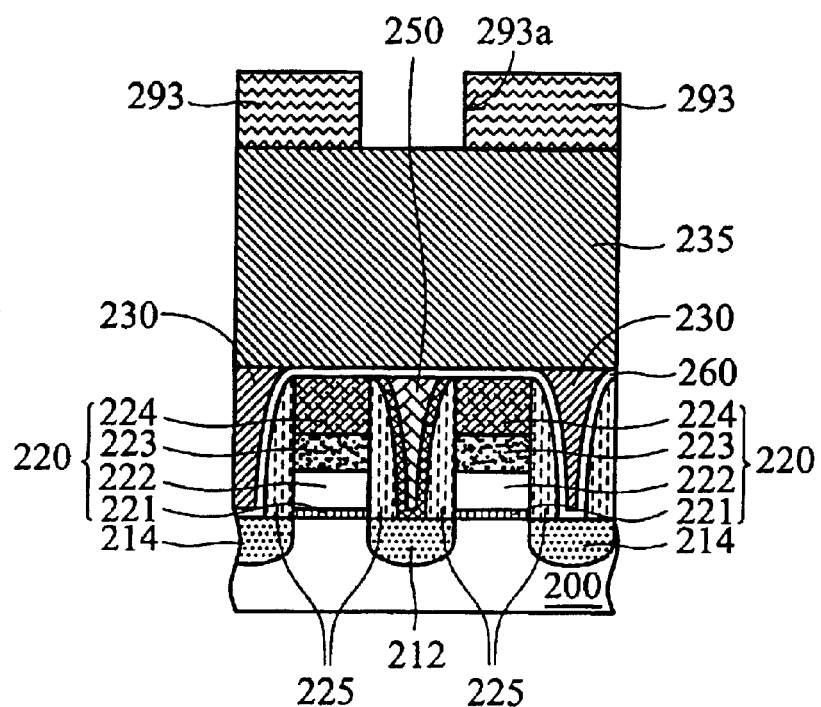

In FIG. 2H, a dielectric layer 235 and patterned resist layer 293 are blanketly formed overlying substrate 200, more specifically, on insulating barrier layer 260 and dielectric 230. The patterned resist layer 293 has an opening 293a exposing a part of dielectric layer 235, where a bit line contact via is subsequently formed. The dielectric layer 235 is preferably an oxide layer formed by CVD, using a precursor comprising tetra ethoxysilane (TEOS).

Figure 2I:
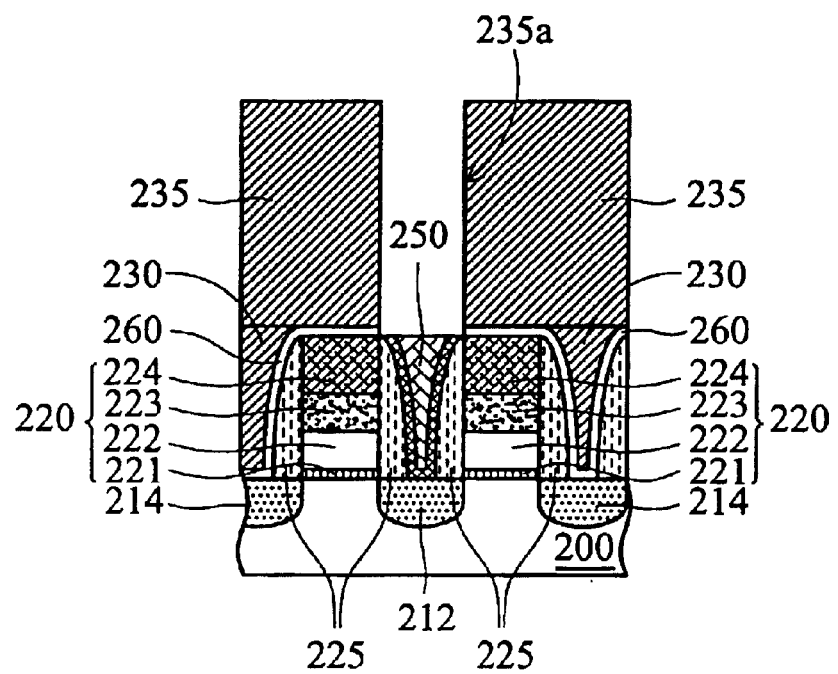

In FIG. 2I, a via 235a is formed by anisotropically etching the dielectric layer 235 and a part of insulating layer 260 on conductive layer 250, using patterned resist layer 293 as an etching mask. The via 235a exposes conductive layer 250 and is a bit line contact via. The patterned resist layer 293 is then removed.

Figure 2J:
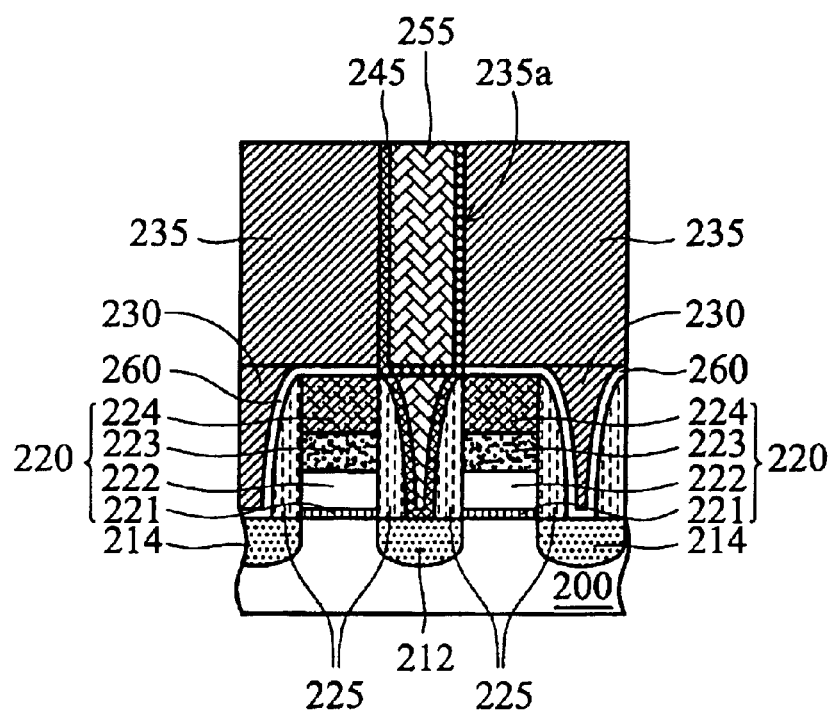

In FIG. 2J, a barrier layer 245 is formed overlying substrate 200, more specifically, on the surface of via 235a. The barrier layer 245 preferably has a TiN/Ti layer. Further, formation of barrier layer 245 can be divided into a plurality of sub-steps such as forming a titanium layer (not shown) overlying substrate 200 using physical vapor deposition (PVD) such as sputtering, and annealing substrate 200 at nitrogen atmosphere, thereby finishing the formation of barrier layer 245. The barrier layer 245 prevents inter-diffusion between dielectric layer 235 and conductive layer 255 subsequently formed in via 235a, which can negatively affect the electrical performance of an end product. The barrier layer 245 can further be a glue layer assisting in fixing the subsequently formed conductive layer 255 on conductive layer 235, drain region 212, and source region 214. Next, the conductive layer 255 is formed overlying barrier layer 245 using CVD or PVD. The conductive layer 235 is preferably tungsten formed by CVD. The unwanted barrier layer 245 and conductive layer 255 are then removed by CMP or etching, preferably using dielectric layer 235 as a stop layer, thereby leaving the barrier layer 245 and conductive layer 255 in via 235*a*.

Thus, the results shown prove efficacy of the inventive method in forming a conductive layer as bit line contact above a drain region prior to forming a dielectric layer overlying the substrate, avoiding both CB opening and word line-bit line short as in the known art, thereby improving process yield and decreasing costs, achieving the objects of the present invention.

Although the present invention has been particularly shown and described with reference to the preferred specific embodiments and examples, it is anticipated that alterations and modifications thereof will no doubt become apparent to those skilled in the art. It is therefore intended that the following claims be interpreted as covering all such alteration and modifications as fall within the true spirit and scope of the present invention.

What is claimed is:

1. A method of filling a bit line contact via, comprising:
   providing a substrate having a transistor thereon, the transistor having a gate electrode, drain region, and source region;
   forming a first barrier layer overlying the sidewall of the gate electrode, drain region, and source region;
   forming a first conductive layer overlying the first barrier layer;
   removing the first barrier layer and first conductive layer above the source region;
   conformally forming an insulating barrier layer overlying the substrate;
   forming a first dielectric layer overlying the insulating barrier layer above the source region;
   blanketly forming a second dielectric layer overlying the substrate;
   forming a via through the second dielectric layer and insulating barrier layer, exposing the first conductive layer;
   forming a second barrier layer overlying the surface of the via; and
   filling the via with a second conductive layer.

2. The method as claimed in claim 1, wherein the first barrier layer comprises a TiN/Ti layer.

3. The method as claimed in claim 1, wherein the first conductive layer is tungsten.

4. The method as claimed in claim 1, wherein the first barrier layer and first conductive layer, above the source region, are removed by reactive ion etching (RIE), using the surface of the gate electrode as a stop layer.

5. The method as claimed in claim 4, wherein gases used during RIE comprise $NF_3$, $Cl_2$, and $O_2$.

6. The method as claimed in claim 1, wherein the insulating barrier layer is SiN.

7. The method as claimed in claim 1, wherein the first dielectric layer is boro-phosphosilicate glass (BPSG).

8. The method as claimed in claim 1, wherein the second dielectric layer is an oxide layer.

9. The method as claimed in claim 1, wherein the second barrier layer comprises a TiN/Ti layer.

10. The method as claimed in claim 1, wherein the second conductive layer is tungsten.

11. A method of a filling bit line contact via, comprising:
    providing a substrate having a transistor thereon, the transistor having a gate electrode, drain region, and source region, the gate electrode covered by a hard mask layer;
    forming a first barrier layer overlying the sidewall of the gate electrode, drain region, and source region;
    forming a first conductive layer overlying the first barrier layer;
    etching the first barrier layer and first conductive layer above the source region using reactive ion etching (RIE), using the hard mask layer as a stop layer;
    conformally forming an insulating barrier layer overlying the first conductive layer, first barrier layer, gate electrode, and source region;
    forming a first dielectric layer overlying the insulating barrier layer above the source region;
    blanketly forming a second dielectric layer overlying the insulating barrier layer and first dielectric layer;
    forming a via through the second dielectric layer and insulating barrier layer, exposing the first conductive layer;
    forming a second barrier layer overlying the surface of the via; and
    filling the via with a second conductive layer.

12. The method as claimed in claim 11, wherein the first barrier layer comprises a TiN/Ti layer.

13. The method as claimed in claim 11, wherein the first conductive layer is tungsten.

14. The method as claimed in claim 11, wherein the hard mask layer is SiN.

15. The method as claimed in claim 11, wherein gases used during RIE comprise $NF_3$, $Cl_2$, and $O_2$.

16. The method as claimed in claim 11, wherein the insulating barrier layer is SiN.

17. The method as claimed in claim 11, wherein the first dielectric layer is boro-phosphosilicate glass (BPSG).

18. The method as claimed in claim 11, wherein the second dielectric layer is an oxide layer.

19. The method as claimed in claim 11, wherein the second barrier layer comprises a TiN/Ti layer.

20. The method as claimed in claim 11, wherein the second conductive layer is tungsten.

* * * * *